United States Patent [19]

Komine et al.

[11] Patent Number: 4,738,915

[45] Date of Patent: Apr. 19, 1988

[54] POSITIVE-WORKING O-QUINONE DIAZIDE PHOTORESIST COMPOSITION WITH 2,3,4-TRIHYDROXYBENZOPHENONE

[75] Inventors: Takashi Komine, Yokohama; Shingo Asaumi, Fujisawa; Akira Yokota, Yamato; Hisashi Nakane, Kawasaki, all of Japan

[73] Assignee: Tokyo Ohka Kogyo Co., Ltd., Kanagawa, Japan

[21] Appl. No.: 32,952

[22] Filed: Mar. 31, 1987

Related U.S. Application Data

[63] Continuation of Ser. No. 781,685, Sep. 30, 1985, abandoned.

[30] Foreign Application Priority Data

Dec. 14, 1984 [JP]  Japan ................................ 59-264144

[51] Int. Cl.$^4$ ................................................ G03C 1/60
[52] U.S. Cl. .................................... 430/191; 430/192; 430/193
[58] Field of Search ........................ 430/191, 192, 193

[56] References Cited

U.S. PATENT DOCUMENTS

| | | | |
|---|---|---|---|
| 3,046,118 | 7/1962 | Schmidt | 430/193 |
| 3,106,465 | 10/1963 | Neugebauer et al. | 430/193 |
| 3,148,983 | 9/1964 | Endermann et al. | 430/193 |
| 3,402,044 | 9/1968 | Steinhoff et al. | 430/192 |
| 4,275,139 | 6/1981 | Stahlhofen | 430/191 |
| 4,499,171 | 2/1985 | Hosaka et al. | 430/193 |
| 4,626,492 | 12/1986 | Eilbeck | 430/191 |

FOREIGN PATENT DOCUMENTS

| | | | |
|---|---|---|---|
| 1561438 | 2/1980 | United Kingdom | 430/191 |
| 332413 | 4/1972 | U.S.S.R. | 430/191 |

OTHER PUBLICATIONS

Carothers, J. A., *IBM Technical Disclosure Bulletin*, vol. 20, No. 9, 2/1978, p. 3569.

*Primary Examiner*—Charles L. Bowers, Jr.
*Attorney, Agent, or Firm*—Wyatt, Gerber, Shoup, Scobey and Badie

[57] ABSTRACT

The invention provides an improvement over the conventional positive-working photoresist compositions comprising a novolac resin and an ester compound between 2,3,4-trihydroxybenzophenone and naphthoquinone-1,2-diazido-5-sulfonic acid in respect of scum formation in development and resistance of the patterned photoresist layer against heat and dry etching. The inventive composition comprises, in addition to the novolac resin and the ester compounds, 2,3,4-trihydroxybenzophenone in a specified amount relative to the ester compounds as a part of the photosensitive component which may be a reaction product obtained by the esterification reaction for the synthesis of the ester compounds containing unesterified 2,3,4-trihydroxybenzophenone.

6 Claims, No Drawings

POSITIVE-WORKING O-QUINONE DIAZIDE PHOTORESIST COMPOSITION WITH 2,3,4-TRIHYDROXYBENZOPHENONE

This application is a continuation of application Ser. No. 06/781,685, filed 09/30/85, now abandoned.

BACKGROUND OF THE INVENTION

The present invention relates to a positive-working photoresist composition or, more particularly, to a positive-working photoresist composition for fine processing of semiconductor devices such as ICs and LSIs having high sensitivity, heat resistance and resistance against dry etching without the problem of scum formation.

In compliance with the explosively expanding demand for computerization and the recent trend in the semiconductor technologies toward more and more increased fineness of the semiconductor devices such as LSIs of which the density of integration has surpassed the level of 64 kilobits and is reaching 256 kilobits in VLSIs, photoresist compositions used in the photolithographic processing of semiconductor devices are also required to have improved properties. Some of the requirements for modern photoresist materials include (1) high sensitivity and high contrast, (2) excellent heat resistance, (3) excellent resistance against etching either in a dry process or in a wet process and (4) absence of scumming in development.

As is known, photoresist compositions are classified into negative-working and positive-working ones depending on the changes in the solubility behavior of the material caused by irradiation with actinic rays and various combinations of the photosensitive ingredient and the base resin have been proposed for the respective types of the photoresist compositions. As to the formulation of the positive-working photoresist compositions, in which the resinous ingredient is imparted with increased solubility by exposure to actinic rays, a class of ester compounds of 2,3,4,-trihydroxybenzophenone with naphthoquinone-1,2-diazido-5-sulfonic acid (referred to as esters hereinbelow) have been proposed as a promising photosensitive compound or photosensitizer including: a (4-) monoester compound (referred to as monoester hereinbelow) of the structural formula (I) below (see U.S. Pat. No. 3,106,465)

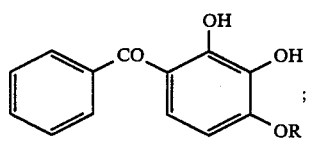

a (3,4-)diester compound (referred to as diester hereinbelow) of the structural formula (II) below (see U.S. Pat. No. 3,148,983 and Japanese Patent Publication No. 37-18015)

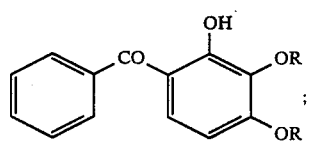

and a (2,3,4-)triester compound (referred to as triester hereinbelow) of the structural formula below (see U.S. Pat. Nos. 3,046,118 and 3,402,044)

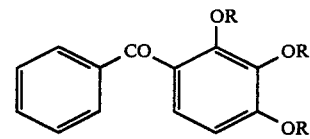

in which R is a residue of naphthoquinone-1,2-diazido-5-sulfonic acid (referred to as acid residue hereinbelow) expressed by the formula

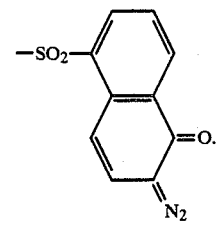

Photoresist compositions comprising the above described di- and triesters and a novolac resin are also disclosed in U.S. Pat. Nos. 3,148,983 and 3,402,044.

It is generally understood hitherto that the positive-working photoresist compositions comprising the esters and the novolac resin can be imparted with a sufficiently high photosensitivity when the novolac resin has a relatively small molecular weight or the amount of the esters is not excessively large.

The use of a novolac resin having a relatively small molecular weight as is mentioned above, however, is disadvantageous in two respects. Namely, the photoresist film formed of the composition has poor heat resistance and cannot withstand the dry etching as is undertaken in the manufacture of VLSIs and scum or residuum of the photoresist film is frequently found in the recessed corners of the patterned photoresist layer formed by development due to the incomplete removal of the photoresist layer. Decrease of the amount of the esters in the photoresist composition, on the other hand, gives nothing to the solution of the latter problem of the scum formation although the former problem of decreased resistance against heat and dry etching can be solved thereby.

SUMMARY OF THE INVENTION

An object of the present invention is to provide a novel and improved positive-working photoresist composition suitable for use in fine processing of various semiconductor devices with high photosensitivity and resistance against heat and dry etching and without the problem of scum formation in development.

A further object of the invention is to provide an improved positive-working photoresist composition comprising a novolac resin and the esters of 2,3,4-trihydroxybenzophenone with naphthoquinone-1,2-diazido-5-sulfonic acid without the above described problems and disadvantages in the prior art compositions of the same type.

Thus, the positive-working photoresist composition of the invention comprises:

(a) 100 parts by weight of a novolac resin, preferably, having a weight-average molecular weight of at least 25,000; and (b) from 10 to 100 parts by weight of a photosensitizer composed of (b-1) from 20 to 55% by weight of at least one of the esters of 2,3,4-trihydroxybenzophenone with naphthoquinone-1,2-diazido-5-sulfonic acid and (b-2) from 80 to 45% by weight of 2,3,4-trihydroxybenzophenone.

DETAILED DESCRIPTION OF THE PREFERRED EMBODIMENTS

The resinous base component, i.e. component (a), in the inventive positive-working photoresist composition is a novolac resin which may be any one of known types including phenol novolacs, cresol novolacs and the like. The novolac resin should preferably have a weight-average molecular weight of at least 25,000 as calculated for polystyrenes. When the molecular weight of the novolac is smaller than above, the photoresist layer would not be imparted with sufficiently high resistance against heat and dry etching.

The photosensitizer, i.e. component (b), combined with the component (a) in the inventive composition is a mixture of (b-1) at least one of the ester compounds and (b-2) 2,3,4-trihydroxybenzophenone. The ester compounds as a part of the component (b) include the mono-, di- and triesters above defined. It is noted that each of the mono- and diesters includes several isomers relative to the position or positions of the acid residue of the formula (IV) in addition to the particular isomers expressed by the structural formulas (I) and (II), respectively, given above. Any single one or any combination thereof can be used in the inventive composition although the triester of the formula (III) is the most preferable from the standpoint of obtaining a photoresist layer imparted with high resistance against heat and dry etching. It is, however, practical to use a mixture of these three types of esters in view of the easiness in the preparation without necessitating further isolation of the component esters from the mixture obtained in the esterification reaction.

The 2,3,4-trihydroxybenzophenone as the counterpart in the component (b) is a starting compound for the esterification synthesis of the ester compounds. When the esterification reaction has been performed using this compound and naphthoquinone-1,2-diazido-5-sulfonyl chloride and the reaction is interrupted at an intermediate stage, therefore, the resultant reaction mixture naturally contains an unreacted amount of the compound along with the ester compounds so that the reaction mixture can be used as such after removal of the sulfonyl chloride provided that the mixture contains an appropriate amount of the unreacted 2,3,4-trihydroxybenzophenone although the photosensitizer is formed by adding a portion of purified 2,3,4-trihydroxybenzophenone to the reaction mixture in order to adjust the proportion thereof or by mixing the respective ingredients each in a purified form.

Characteristically, 2,3,4-trihydroxybenzophenone has an extremely high solubility in alkaline developer solutions so that the problem of scum formation on the patterned photoresist layer can almost completely be solved by the combined use thereof with the esters in contrast to the conventional compositions containing the ester compounds alone as the photosensitizer.

The photosensitizer as the component (b) in the inventive composition is a mixture of the esters and 2,3,4-trihydroxybenzophenone and the mixing ratio of the former to the latter is critically limited in the range from 20:80 to 55:45 or, preferably, from 30:70 to 50:50 by weight. When the reaction mixture obtained in the esterification synthesis of the esters is used as such to utilize the amount of the unreacted 2,3,4-trihydroxybenzophenone, the proportion of the esters to the benzophenone compound in the mixture can be determined by the gel permeation chromatography (GPC) combined with ultraviolet (UV) absorption spectrophotometry to give an elution diagram for the relationship between the volume of the eluate and the ultraviolet absorbance of the eluate at a wave length of 310 nm assuming that the areas surrounded by the spectral curve and the base line are proportional to the concentrations of the respective ingredients in the eluate. For example, the mixture is dissolved in tetrahydrofuran in an appropriate concentration and the solution is subjected to analysis by the GPC-UV absorption spectrophotometry at the specified wave length to give the elution diagram. When the thus determined concentration of the unreacted benzophenone compound relative to the ester compounds is lower than the above specified preferable content thereof in the component (b), a calculated amount of pure 2,3,4-trihydroxybenzophenone should be added to the reaction mixture although it is optional that the novolac resin is separately admixed with the reaction mixture of the esterification reaction and a supplementary amount of the unesterified benzophenone compound.

The amount of the above described photosensitive component as the component (b) in the inventive photoresist composition should be in the range from 10 to 100 parts by weight or, preferably, from 20 to 40 parts by weight per 100 parts by weight of the novolac resin as the component (a). When the amount of the photosensitive component (b) is smaller than the lower limit of the above range, the resolving power of the patterned photoresist layer may be decreased due to the remarkably increased reduction of the film thickness by development in the unexposed areas. When the amount of the photosensitive component (b) is too large, on the other hand, the photosensitivity of the photoresist composition is rather decreased though advantageous in respect of the resolving power.

The positive-working photoresist composition of the invention may preferably further comprise, in addition to the above described components (a) and (b), an organic solvent dissolving the components (a) and (b) so that the composition is in the form of a solution suitable for application to the substrate surface. Examples of suitable organic solvent include ketones such as acetone, methyl ethyl ketone, cyclohexanone, isoamyl ketone and the like, polyhydric alcohols and ether or ester derivatives thereof such as ethylene glycol, ethylene glycol monoacetate, diethylene glycol, monomethyl, monoethyl, monopropyl, monobutyl and monophenyl ethers of diethylene glycol or diethylene glycol monoacetate, cyclic ethers such as dioxane, esters such as methyl, ethyl and butyl acetates, and the like. These solvents may be used either singly or as a combination of two kinds or more according to need.

It is apparent that the positive-working photoresist composition of the invention may be further admixed with various kinds of additives miscible with the above described components and conventionally used in photoresist compositions. Some of the additives include supplementary resins, plasticizers, stabilizers and coloring agents which serve to increase the visibility of the patterned photoresist layer after development.

To describe a typical way for the use of the inventive photoresist composition, a substrate such as a silicon wafer is coated with the composition which is preferably in the form of a solution by use of a suitable coater machine such as a spinner followed by drying to form a photosensitive layer on the surface. Then, the photosensitive layer is exposed patternwise through a patterned photomask to ultraviolet light from a UV light source such as a low pressure mercury lamp, high pressure mercury lamp, ultra-high pressure mercury lamp, arc lamp and xenon lamp or exposed patternwise to scanning electron beams. The thus exposed photoresist layer on the substrate surface is then dipped in a weakly alkaline developer solution which may be an aqueous solution of an inorganic alkali, e.g. sodium hydroxide, in a concentration of 1 to 2% by weight or an organic alkali, e.g. tetraalkylammonium hydroxides, in a concentration of 1 to 3% by weight so that the photoresist layer on the areas exposed to UV light or electron beams, where the photoresist composition has been imparted with increased solubility with high sensitivity, is dissolved away to leave a patterned photoresist layer having high fidelity to the pattern of the photomask or the scanning pattern of the electron beams. The patterned photoresist layer obtained in this manner is highly resistant against heat and dry etching and no problem of scum formation is caused even in an extremely fine patterning with a line width of 2 $\mu$m or smaller so that the inventive photoresist composition is useful as a photosensitive material for fine processing of various electronic devices such as ICs and LSIs.

In the following, the photoresist composition of the invention is further described in detail by way of examples.

PREPARATION 1

The esterification reaction of 2,3,4-trihydroxybenzophenone was performed by dissolving 23.0 g (0.1 mole) of the benzophenone compound and 34.9 g (0.13 mole) of naphthoquinone-1,2-diazido-5-sulfonyl chloride in 250 g of dioxane and adding 32 ml of a 25% by weight aqueous solution of sodium carbonate dropwise into the solution over a period of about 45 minutes. The resultant reaction mixture was filtered and the filtrate was admixed with 1 liter of a dilute hydrochloric acid of 3% by weight concentration. The precipitates formed in the mixture were collected by filtration and washed several times with pure water followed by dehydration with suction and air-drying.

The GPC-UV analysis of the thus obtained reaction product indicated that it was a mixture of 17.5% by weight of the triester, 13.6% by weight of the diester, 18.7% by weight of the monoester and 50.2% by weight of the unesterified benzophenone compound.

PREPARATION 2

The experimental procedure for the esterification reaction was about the same as in Preparation 1 described above. Namely, 11.5 g (0.05 mole) of 2,3,4-trihydroxybenzophenone and 39.2 g (0.146 mole) of naphthoquinone-1,2-diazido-5-sulfonyl chloride were dissolved in 250 g of dioxane and 35 ml of a 25% by weight aqueous solution of sodium carbonate were added dropwise to the mixture over a period of about 45 minutes followed by the subsequent treatment of the reaction mixture in the same manner as in Preparation 1 above to give a dried powdery reaction product.

The GPC-UV analysis of this product indicated that it was a mixture of 92.3% by weight of the triester, 4.9% by weight of the diester, 2.3% by weight of the monoester and 0.5% by weight of the unesterified benzophenone compound.

EXAMPLE 1

A photosensitive composition in the form of a solution was prepared by dissolving 5 g of the powdery product obtained in Preparation 1 and 15 g of a cresol novolac resin having a weight-average molecular weight of 27,000 in 60 g of ethylene glycol monoethyl ether acetate. A silicon wafer was coated with the solution on a spinner coater followed by drying and baking for 90 seconds at 110° C. on a hot plate to give a surface film having a thickness of 1.3 $\mu$m. The silicon wafer thus provided with the photosensitive layer was exposed to ultraviolet light on a mask aligner through a test chart photomask and then developed by dipping for 1 minute in a 2.38% by weight aqueous solution of tetramethylammonium hydroxide at 23° C. followed by rinse with deionized water to give a patterned photoresist layer. The development was complete with the photoresist layer dissolved away on the exposed areas when the length of the exposure time was 4.0 seconds or longer. No scum, i.e. residuum of the photoresist layer, was found after the development in the pattern with fineness as fine as 2 $\mu$m.

The silicon wafer thus provided with the patterned photoresist layer was post-baked at 160° C. for 20 minutes in a Thomas pile-up oven of air convection type to find absolutely no deformation of the patterned lines by heating. When the temperature of the post-baking was increased to 170° C. with decrease of the post-baking time to 20 minutes, appearance of slight roundness was found along the shoulder edges of the patterned lines.

EXAMPLE 2

A photosensitive composition in the form of a solution was prepared by dissolving 4.5 g of the dried powdery product obtained in Preparation 1, 0.5 g of pure 2,3,4-trihydroxybenzophenone and 15 g of a cresol novolac resin having a weight-average molecular weight of 42,000 in 60 g of ethylene glycol monoethyl ether acetate and the solution was used for providing a patterned photoresist layer on a silicon wafer in the same manner as in Example 1 to be evaluated. The minimum exposure time for complete development was 4.1 seconds and no scum was found after the development even in the finest pattern of 2 $\mu$m line width. The heat resistance of the patterned photoresist layer by post-baking was as good as in Example 1.

COMPARATIVE EXAMPLE 1

A photosensitive composition in the form of a solution was prepared by dissolving 5 g of the dried powdery product obtained in Preparation 2 and 15 g of a cresol novolac resin having a weight-average molecular weight of 16,000 in 60 g of ethylene glycol monoethyl ether acetate. The patterning test was performed using this solution in the same manner as in Example 1 to find that the minimum exposure time for complete development was 3.8 seconds but a small amount of scum was found. The post-baking test of the patterned photoresist layer gave results that no deformation was found in the patterned lines by heating at 130° C. for 20 minutes but appearance of slight roundness was found along the shoulder edges of the lines by heating at 140° C. for 20 minutes.

COMPARATIVE EXAMPLE 2

The experimental procedure was substantially the same as in Comparative Example 1 except that the weight-average molecular weight of the cresol novolac resin was 27,000 instead of 16,000 and the composition was evaluated in the same manner as in Example 1. The result of the patterning and development test was that the minimum exposure time for complete development was 4.8 seconds with formation of scum and the post-baking test gave results that no deformation was found in the patterned lines by heating at 160° C. for 20 minutes but appearance of slight roundness was found along the shoulder edges of the lines by heating at 170° C. for 20 minutes.

COMPARATIVE EXAMPLE 3

A photosensitive composition in the form of a solution was prepared by dissolving each 2.5 g of the dried powdery products obtained in Preparations 1 and 2 and 15 g of a cresol novolac resin having a weight-average molecular weight of 17,000 in 60 g of ethylene glycol monoethyl ether acetate and the composition was evaluated in the same manner as in Example 1. The result of the patterning and development test was that the minimum exposure time for complete development was 3.9 seconds with formation of scum and the results of the post-baking test were that no deformation of the patterned lines was found by heating at 130° C. for 20 minutes but appearance of slight roundness was found along the shoulder edges of the lines by heating at 140° C. for 20 minutes.

EXAMPLE 3

A photosensitive composition in the form of a solution was prepared by dissolving 2.0 g of the dried powdery product obtained in Preparation 2, 3.0 g of unesterified 2,3,4-trihydroxybenzophenone and 15 g of a cresol novolac resin having a weight-average molecular weight of 27,000 in 60 g of ethylene glycol monoethyl ether acetate and the composition was evaluated in the same manner as in Example 1. The result of the patterning and development test was that the minimum exposure time for complete development was 3.8 seconds with absolutely no formation of scum and the post-baking test gave results that no deformation of the patterned lines was found by heating at 160° C. for 20 minutes but appearance of slight roundness was found along the shoulder edges of the lines by heating at 170° C. for 20 minutes.

What is claimed is:

1. A positive-working photoresist composition which comprises an admixture of:
   (a) 100 parts by weight of a novolac resin; and
   (b) from 10 to 100 parts by weight of a photosensitive component composed of
      (b-1) from 20 to 55% by weight of at least one ester compound selected from the group consisting of the mono-, di- and triesters formed by reaction of 2,3,4-trihydroxybenzophenone with naphthoquinone-1,2-diazido-5-sulfonic acid, and
      (b-2) from 80 to 45% by weight of 2,3,4-trihydroxybenzophenone.

2. The positive-working photoresist composition as claimed in claim 1 which further comprises an organic solvent dissolving the components (a) and (b).

3. The positive-working photoresist composition as claimed in claim 1 wherein the photosensitive component is a reaction product of the esterification reaction between 2,3,4-trihydroxybenzophenone and naphthoquinone-1,2-diazido-5-sulfonyl chloride containing unreacted 2,3,4-trihydroxybenzophenone.

4. The positive-working photoresist composition as claimed in claim 1 wherein the novolac resin has a weight-average molecular weight of at least 25,000.

5. The positive-working photoresist composition as claimed in claim 1 wherein the novolac resin is a cresol novolac resin.

6. The positive-working photoresist composition as claimed in claim 2 wherein the organic solvent is ethylene glycol monoethyl ether acetate.

* * * * *